(12) United States Patent
Tan et al.

(10) Patent No.: US 9,150,407 B2
(45) Date of Patent: *Oct. 6, 2015

(54) METHOD FOR FABRICATING MEMS DEVICE WITH PROTECTION RINGS

(71) Applicant: UNITED MICROELECTRONICS CORPORATION, Hsinchu (TW)

(72) Inventors: Tzung-Han Tan, Taipei (TW); Bang-Chiang Lan, Taipei (TW); Ming-I Wang, Taipei County (TW); Chien-Hsin Huang, Taichung (TW); Meng-Jia Lin, Changhua County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 203 days.

This patent is subject to a terminal disclaimer.

(21) Appl. No.: 13/945,892

(22) Filed: Jul. 18, 2013

(65) Prior Publication Data

US 2013/0302933 A1 Nov. 14, 2013

Related U.S. Application Data

(60) Division of application No. 12/943,269, filed on Nov. 10, 2010, now Pat. No. 8,525,389, which is a continuation-in-part of application No. 12/202,563, filed on Sep. 2, 2008, now Pat. No. 7,851,975.

(51) Int. Cl.
*H04R 31/00* (2006.01)
*B81C 1/00* (2006.01)
*B81B 3/00* (2006.01)

(52) U.S. Cl.
CPC ........... *B81C 1/00246* (2013.01); *B81B 3/0072* (2013.01); *B81B 2203/04* (2013.01); *B81B 2207/015* (2013.01); *B81C 2201/0167* (2013.01)

(58) Field of Classification Search
USPC ........ 29/592.1, 606, 622, 825, 830, 832, 840, 29/843, 846, 874; 257/659, 704, E21.499, 257/E23.114; 216/33, 36, 80; 381/163; 438/52
See application file for complete search history.

(56) References Cited

U.S. PATENT DOCUMENTS

| 5,573,679 | A | 11/1996 | Mitchell |
| 5,880,921 | A * | 3/1999 | Tham et al. .................... 361/233 |
| 6,872,902 | B2 | 3/2005 | Cohn |
| 7,329,933 | B2 | 2/2008 | Zhe |
| 7,898,081 | B2 * | 3/2011 | Lan et al. ....................... 257/734 |
| 8,096,048 | B2 | 1/2012 | Lan |
| 8,410,561 | B2 | 4/2013 | Sato |
| 2004/0053124 | A1 | 3/2004 | LaFollette |
| 2005/0076719 | A1 | 4/2005 | Jakobsen |

(Continued)

*Primary Examiner* — Paul D Kim
(74) *Attorney, Agent, or Firm* — Ding Yu Tan

(57) ABSTRACT

A method for fabricating a microelectromechanical system (MEMS) device of the present invention includes the following steps: providing a substrate, comprising a circuit region and a MEMS region separated from each other; forming an interconnection structure on the substrate in the circuit region, and simultaneously forming a plurality of dielectric layers and a first electrode on the substrate in the MEMS region, wherein the first electrode comprises at least two metal layers formed in the dielectric layers and a protection ring formed in the dielectric layers and connecting two adjacent metal layers, so as to define an enclosed space between the two adjacent metal layers; forming a second electrode on the first electrode; and removing the dielectric layers outside the enclosed space in the MEMS region to form a cavity between the electrodes.

11 Claims, 6 Drawing Sheets

(56) References Cited

U.S. PATENT DOCUMENTS

| | | |
|---|---|---|
| 2005/0087826 A1 | 4/2005 | Rodgers |
| 2007/0024399 A1 | 2/2007 | Martin Antolin |
| 2007/0040270 A1 | 2/2007 | Coenen |
| 2009/0049911 A1 | 2/2009 | Fukuda |
| 2009/0243004 A1 | 10/2009 | Lan |
| 2010/0002894 A1 | 1/2010 | Lan |
| 2011/0068422 A1 | 3/2011 | Quevy |

* cited by examiner

METHOD FOR FABRICATING MEMS DEVICE WITH PROTECTION RINGS

CROSS-REFERENCE TO RELATED APPLICATION

This present application is a divisional application claiming benefit of U.S. patent application bearing Ser. No. 12/943,269 filed on Nov. 10, 2010, now U.S. Pat. No. 8,525,389, which is a continuation-in-part application of U.S. patent application Ser. No. 12/202,563 filed on Sep. 2, 2008, now U.S. Pat. No. 7,851,975. The entirety of the above-mentioned patent applications are hereby incorporated by reference herein and made a part of this specification.

FIELD OF THE INVENTION

The present invention generally relates to a microelectromechanical system (MEMS) device and a method for fabricating the same, and in particular, to a MEMS device having an electrode with high stiffness and a method for fabricating the same.

BACKGROUND OF THE INVENTION

A microelectromechanical system (MEMS) is a microelectromechanical device fabricated in a microminiaturized package structure, and the fabricating technique thereof is quite similar to that of integrated circuits (ICs). However, interactions, for example, about mechanics, optics, or magnetic force between the MEMS device and surrounding environment are more than that of the conventional IC. The MEMS device may include micro-sized electromechanical components, such as motors, pumps, valves, switches, capacitors, accelerometers, sensors, capacitive sensors, pixels, microphones, or actuators, etc. The electromechanical components, which are designed based on capacitance principles, usually work out by the coaction between the mechanical structure and the semiconductor device (e.g. IC).

In general, microphones fabricated by adopting the MEMS technology are advantageous in light weight, compact size, and desirable signal quality, and become the mainstream of miniature microphones. Furthermore, due to increasing demands for wide application of the miniature microphones in electronic products such as mobile phones, requirements for sound-receiving quality and integration of the MEMS microphone with the circuit are further highlighted.

SUMMARY OF THE INVENTION

Accordingly, the present invention is directed to a MEMS device having an electrode with high stiffness.

The present invention is directed to a method for fabricating a MEMS device, by which the MEMS device can be integrated with a complementary metal oxide semiconductor (CMOS) process.

A MEMS device of the present invention includes a first electrode and a second electrode. The first electrode is disposed on a substrate, and includes at least two metal layers, a first protection ring and a dielectric layer. The first protection ring connects two adjacent metal layers, so as to define an enclosed space between the two adjacent metal layers. The dielectric layer is disposed in the enclosed space and connects the two adjacent metal layers. The second electrode is disposed on the first electrode, wherein a cavity is formed between the first electrode and the second electrode.

According to an embodiment of the present invention, in the MEMS device, the first protection ring substantially corresponds to a profile of each metal layer.

According to an embodiment of the present invention, in the MEMS device, material of the first protection ring includes metal.

According to an embodiment of the present invention, in the MEMS device, the first electrode further includes at least one second protection ring disposed in the enclosed space and connecting the two adjacent metal layers.

According to an embodiment of the present invention, in the MEMS device, material of the second protection ring includes metal.

According to an embodiment of the present invention, in the MEMS device, the first electrode further includes a plurality of vent holes.

According to an embodiment of the present invention, in the MEMS device, the second electrode includes a first insulating layer, a second insulating layer, and a conductive layer located between the first insulating layer and the second insulating layer.

According to an embodiment of the present invention, in the MEMS device, the first electrode and the second electrode are suspended on the substrate.

A method for fabricating a MEMS device of the present invention is described as follows. A substrate is provided, including a circuit region and a MEMS region separated from each other. An interconnection structure is formed on the substrate in the circuit region, and simultaneously a plurality of dielectric layers and a first electrode are formed on the substrate in the MEMS region. The first electrode includes at least two metal layers and a first protection ring. The metal layers and the first protection ring are formed in the dielectric layers. The first protection ring connects two adjacent metal layers, so as to define an enclosed space between the two adjacent metal layers. A second electrode is formed on the first electrode. The dielectric layers outside the enclosed space in the MEMS region are removed.

According to an embodiment of the present invention, in the method for fabricating the MEMS device, the first protection ring substantially corresponds to a profile of each metal layer.

According to an embodiment of the present invention, in the method for fabricating the MEMS device, material of the first protection ring includes metal.

According to an embodiment of the present invention, the method for fabricating the MEMS device further includes forming at least one second protection ring in the enclosed space and connecting the two adjacent metal layers.

According to an embodiment of the present invention, in the method for fabricating the MEMS device, material of the second protection ring includes metal.

According to an embodiment of the present invention, in the method for fabricating the MEMS device, the first electrode includes a plurality of vent holes.

According to an embodiment of the present invention, in the method for fabricating the MEMS device, the step of forming the second electrode includes forming a first insulating layer and a second insulating layer on the dielectric layers, and forming a conductive layer between the first insulating layer and the second insulating layer.

According to an embodiment of the present invention, the method for fabricating the MEMS device further includes forming a passivation layer on the interconnection structure and the dielectric layers before forming the second electrode.

According to an embodiment of the present invention, the method for fabricating the MEMS device further includes removing the passivation layer in the MEMS region, so that a cavity is formed between the first electrode and the second electrode.

According to an embodiment of the present invention, the method for fabricating the MEMS device further includes forming a MOS device in the circuit region before forming the first electrode, wherein the MOS device connects with the interconnection structure.

As mentioned above, the MEMS device of the present invention includes the protection ring and the dielectric layer for connecting two adjacent metal layers, and thereby the electrode can be provided with high stiffness. Further, the fabrication of the MEMS device can be integrated with that of the semiconductor device, e.g. CMOS process. Hence, not only the fabricating process is simplified, sensitivity and performance of the MEMS device can be more effectively enhanced.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

Figure 1A:
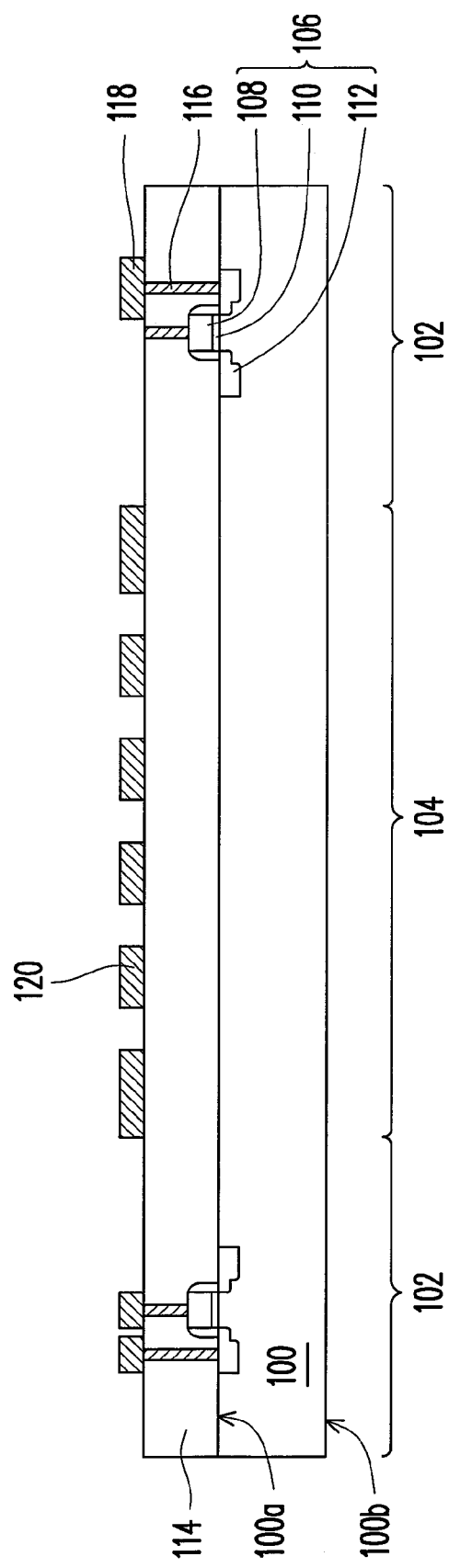
FIGS. 1A-1D depict, in a cross-sectional view, a method for fabricating a MEMS device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1D depict, in a cross-sectional view, a method for fabricating a MEMS device according to an embodiment of the present invention. FIG. 2 is a bottom-view diagram schematically illustrating of a part of an electrode (e.g. backplate) in FIG. 1D according to an embodiment of the present invention. The fabrication of the MEMS device in the present invention can be integrated with a back end of the CMOS process, so as to simplify manufacturing procedures. Therefore, in the following embodiments, the procedures for fabricating MOS devices, the interconnection process, and the MEMS process are incorporated at the same time to illustrate the present invention. Moreover, for illustration purposes, the following disclosure is described in terms of a MEMS microphone, which is illustrated only as an exemplary example, and should not be adopted for limiting the scope of the present invention. Types of the MEMS device to be formed are not particularly limited by the present invention, whereas people skilled in the art should be able to embody the invention based on the illustration to obtain desirable devices having a structure, e.g. electrode, with high stiffness.

Figure 2:
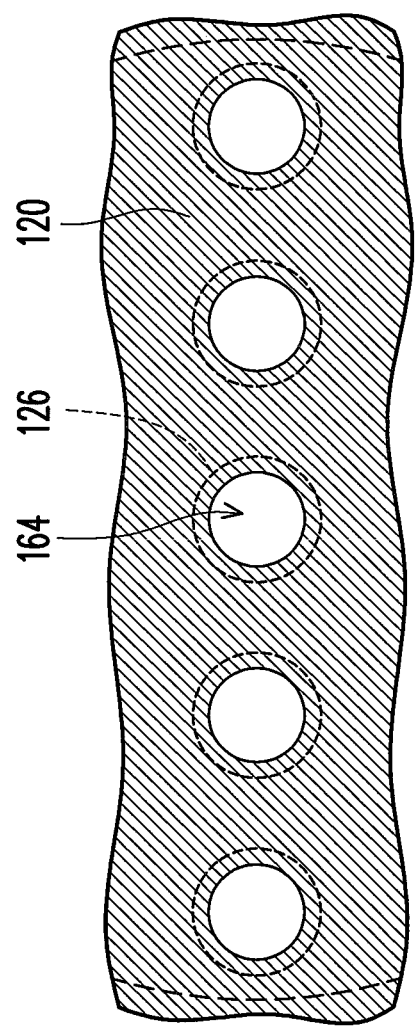
FIG. 2 is a bottom-view diagram schematically illustrating of a part of an electrode in FIG. 1D according to an embodiment of the present invention.

Referring to FIG. 1A, a substrate 100 is provided, which may be a semiconductor wafer, e.g. N- or P-type silicon wafer. The substrate 100, for example, has a front side 100a and a back side 100b. The substrate 100 has a circuit region 102 and a MEMS region 104 separated from each other. In an embodiment, the circuit region 102 surrounds the MEMS region 104. A front end process is then performed, so as to form MOS devices 106 on the front side 100a of the substrate 100 in the circuit region 102. The MOS devices 106 are, for example, N-channel MOS devices, P-channel MOS devices, or CMOS devices. In an embodiment, each of the MOS device 106 may include a gate 108 disposed on the substrate 100, a gate dielectric layer 110 disposed between the gate 108 and the substrate 100, and doped regions 112 disposed in the substrate 100 at both sides of the gate 108.

Thereafter, a back end process is performed to form a dielectric layer 114 on the front side 100a of the substrate 100. Contacts 116 are then formed in the dielectric layer 114 within the circuit region 102. The contacts 116 longitudinally connect the MOS devices 106, for example, via the gate 108 or the doped regions 112. The material of the dielectric layer 114 can be oxide or other suitable dielectrics. The material of the contacts 116 is, for example, tungsten, copper or other suitable metals or alloys. During the back end process, wires 118 and a metal layer 120, i.e. referred to as Metal 1 (M1), are respectively formed on the dielectric layer 114 within the circuit region 102 and the MEMS region 104 of the substrate 100. The wires 118 are electrically connected to the contacts 116. The wires 118 and the metal layer 120 are formed, for example, by forming a conductive layer on the dielectric layer 114, and conducting a lithography process and an etching process to pattern the conductive layer. In an embodiment, a plurality of openings can be further formed in the metal layer 120 via patterning, so that the metal layer 120 may have a meshed pattern. The material of the wires 118 and the metal layer 120 can be aluminum, copper or other suitable metals or alloys. The fabrication of the contacts 116, the wires 118 and the metal layer 120 is known by one of ordinary skill in the art, e.g. a dual damascene process, and the detail thereof is thus not described herein.

Figure 1B:
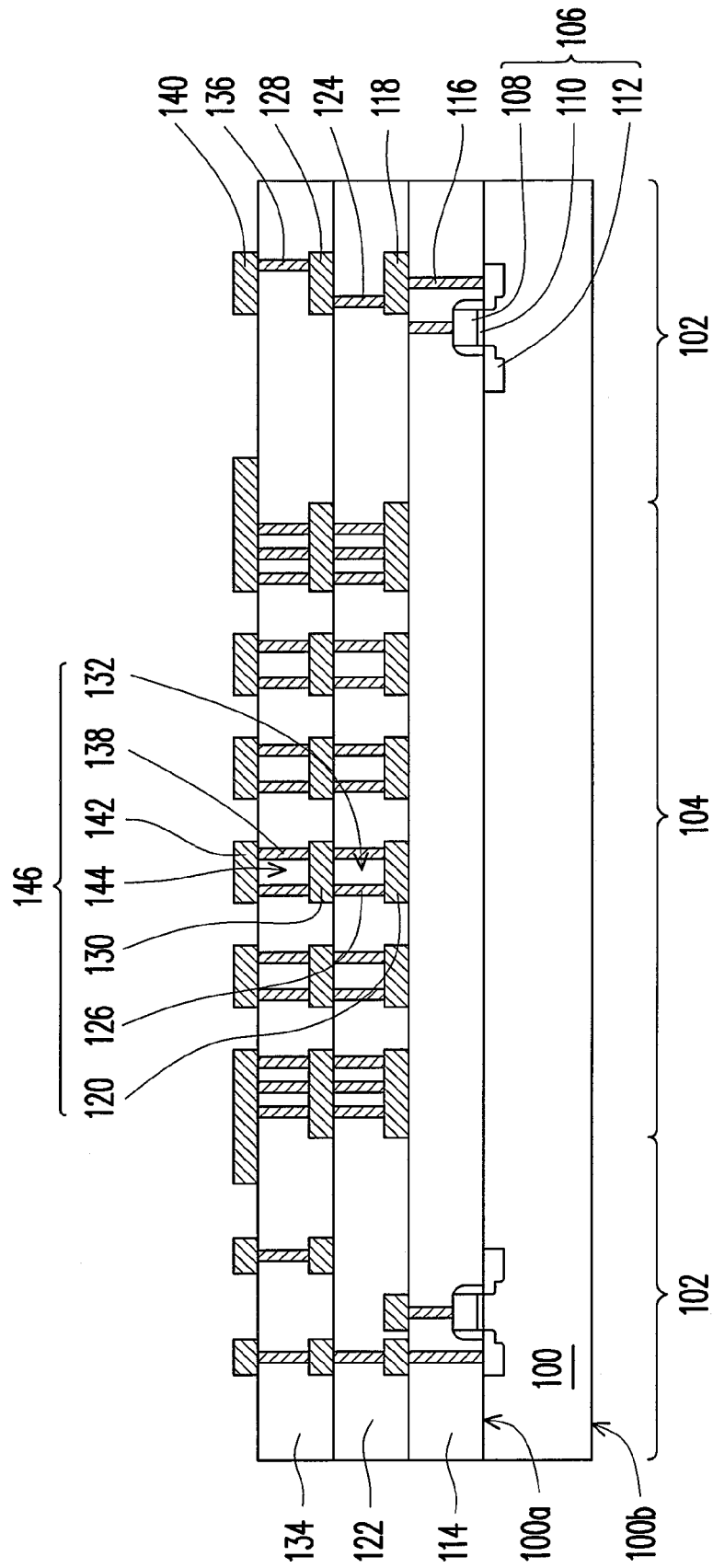

Referring to FIG. 1B, a dielectric layer 122 is formed on the front side 100a of the substrate 100. Vias 124 and protection rings 126 are formed in the dielectric layer 122 within the circuit region 102 and the MEMS region 104, respectively. Wires 128 and a metal layer 130, i.e. referred to as Metal 2 (M2), are formed on the dielectric layer 122 respectively in the circuit region 102 and the MEMS region 104. The vias 124, for example, electrically connect the wires 118 to the wires 128. The protection rings 126 are disposed on the metal layer 120 and connected thereto. In an embodiment, each of the protection rings 126 can be configured as an annular form, which, for example, surrounds the respective opening formed in the metal layer 120. The metal layer 130 connected to the protection rings 126 may be patterned as the metal layer 120, that is, with a meshed pattern. The material of the dielectric layer 122 is, for example, oxide or other suitable dielectrics. The material of the vias 124 and the protection rings 126 is, for example, tungsten, copper or other suitable metals or alloys. The material of the wires 128 and the metal layer 130 can be aluminum, copper or other suitable metals or alloys.

It should be noticed that the metal layers 120 and 130 stacked in the MEMS region 104 are separated from each other, wherein the metal layer 130 formed on the dielectric layer 122 corresponds to the position of the metal layer 120 in a vertical direction. The protection rings 126 connect the adjacent metal layers 120 and 130, so as to define enclosed spaces 132 therebetween, correspondingly. In an embodiment, each of the protection rings 126 substantially corresponds to a profile of the metal layers 120 and 130. The enclosed spaces 132 may accommodate the partial dielectric layer 122 located between the stacked metal layers 120 and 130.

Likewise, a dielectric layer 134 is formed on the front side 100a of the substrate 100. Then, vias 136 and protection rings 138 are formed in the dielectric layer 134 within the circuit region 102 and the MEMS region 104 of the substrate 100, respectively. Wires 140 and a metal layer 142, i.e. referred to as Metal 3 (M3), are formed on the dielectric layer 134 respectively in the circuit region 102 and the MEMS region 104. The vias 136, for example, electrically connect the wires 128 to the wires 140. The protection rings 138 are disposed on the metal layer 130 and connected thereto. The metal layer 142 is connected to the protection rings 138. In an embodiment, each of the protection rings 138 can be configured as an annular form, which may correspond to the protection rings 126. In an embodiment, each of the protection rings 138 substantially corresponds to a profile of the metal layers 130 and 142. Since the metal layer 142 is formed above the metal layer 130 in a vertical direction, the protection rings 138 connecting the adjacent metal layers 130 and 142 define enclosed spaces 144 therebetween, correspondingly. The enclosed space 144 may accommodate the partial dielectric layer 134 located between the stacked metal layers 130 and 142. The material of the dielectric layer 134 is, for example, oxide or other suitable dielectrics. The material of the vias 136 and the protection rings 138 is, for example, tungsten, copper or other suitable metals or alloys. The material of the wires 140 and the metal layer 142 can be aluminum, copper or other suitable metals or alloys.

Accordingly, as shown in FIG. 1B, the protection rings 126 and 138 respectively formed between the metal layers 120, 130 and 142 may have annular shapes approximating to the profile of the openings formed in the metal layer 120. The annular protection rings 126 and 138 can connect to the inside near to the edge of the metal layers 120, 130 and 142, respectively. The protection rings 126 and 138 can encircle portions of the dielectric layers 122 and 134 in the enclosed spaces 132 and 144 between two of the adjacent metal layers 120, 130 and 142 slightly inside the edge of the metal layers 120, 130 and 142, respectively. The metal layers 120, 130 and 142 and the protection rings 126 and 138 are therefore formed in a stacked manner, which can function as an electrode 146, i.e. backplate, in a MEMS device. In an embodiment, the metal layers 120, 130 and 142 can be Aluminum, Copper, or Gold with a thickness of about 3000 angstroms to 7000 angstroms, possibly about 5000 angstroms, while the dielectric layers 122 and 134 accommodated in the enclosed spaces 132 and 144 can be silicon oxide with a thickness of about 7000 angstroms to 11000 angstroms, possibly about 9000 angstroms, respectively.

Since the process of the MEMS region 104 can be integrated with that of the circuit region 102 in an embodiment of the present invention, the fabrication in the MEMS region 104 can be carried out by the techniques applied to the interconnection process of the circuit region 102. For further details, the metal layers 120, 130 and 142 are formed in the MEMS region 104, while the corresponding wires 118, 128 and 140 of an interconnection structure are formed in the circuit region 102 simultaneously. The protection rings 126 and 138 are formed in the MEMS region 104, while the corresponding vias 124 and 136 of the interconnection structure are formed in the circuit region 102 simultaneously.

Figure 1C:
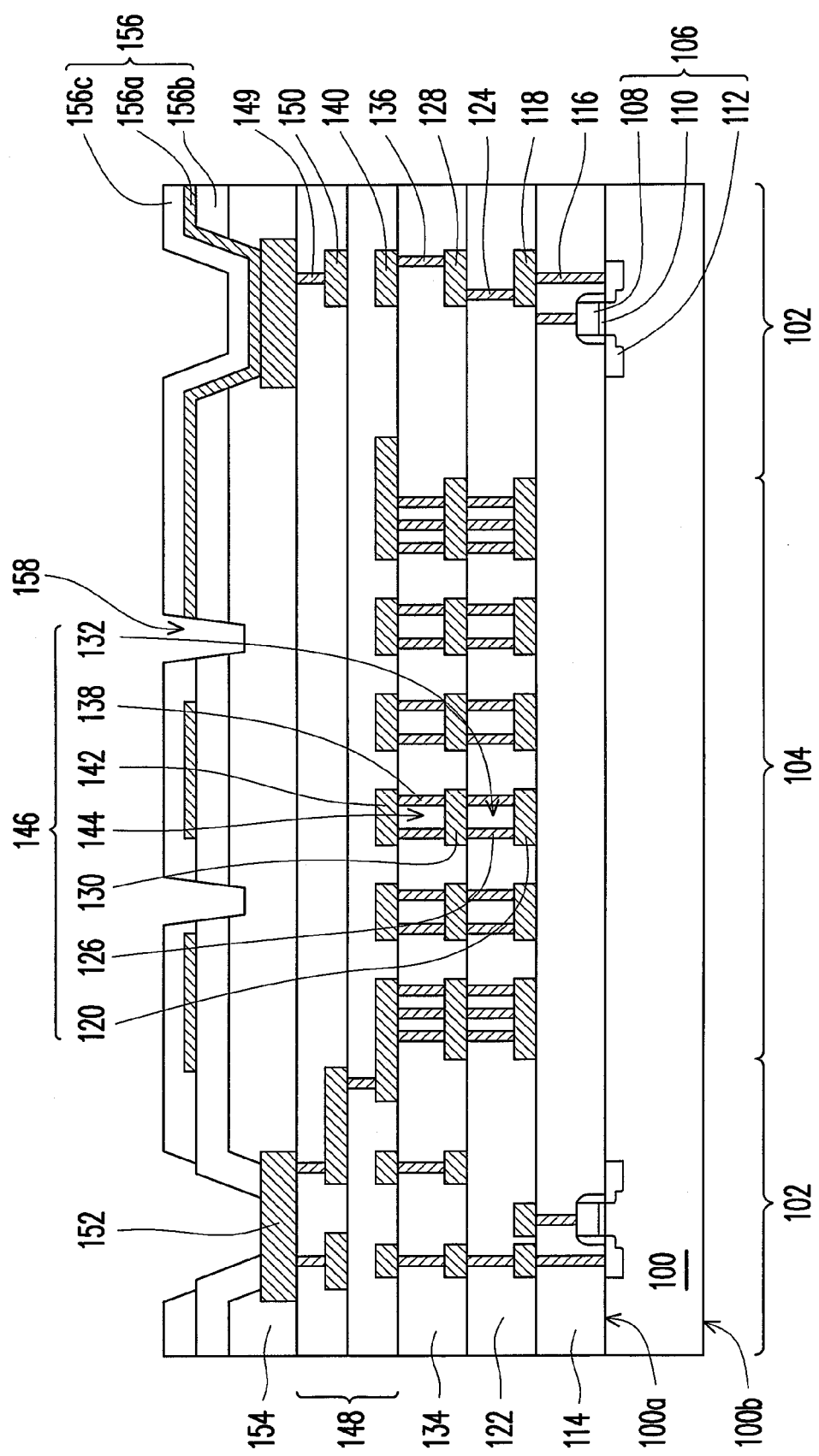

Referring to FIG. 1C, a dielectric layer 148 is formed on the front side 100a of the substrate 100, and vias 149 and wires 150 are formed in the dielectric layer 148, so as to accomplish the interconnection structure on the front side 100a of the substrate 100 in the circuit region 102. The material of the dielectric layer 148 is, for example, oxide or other suitable dielectrics, and the dielectric layer 148 may be composed of multiple layers in which vias 149 and wires 150 are formed, but does not limit the scope of this invention. The accomplishment of the interconnection structure can be implemented in a similar manner mentioned above, and are not specifically described herein again. Afterwards, bonding pads 152 electrically connected to the interconnection structure are formed on the dielectric layer 148 in the circuit region 102. A passivation layer 154 is then formed on the front side 100a of the substrate 100, and covers the dielectric layer 148. The material of the passivation layer 154 is, for example, oxide or other suitable dielectrics.

Thereafter, another electrode 156 is formed on the passivation layer 154 in the MEMS region 104. The electrode 156 may be a diaphragm, in which a conductive layer 156a is sandwiched in between two insulating layers 156b and 156c thereby forming a sandwich structure. In this case, the insulating layers 156b and 156c can balance stress from the upper and lower sides of the electrode 156. Through-holes 158 can be disposed in the electrode 156, such that a portion of the passivation layer 154 and optionally the bonding pads 152 are exposed.

The electrode 156 is, for example, formed by the procedures as follows. A first insulating material layer is formed on the passivation layer 154, a conductive material layer is then formed on the first insulating material layer, and a lithography and an etching process are performed to pattern the conductive material layer to obtain a patterned conductive layer 156a. Then, a second insulating material layer is formed on the conductive layer 156a, and a lithography and etching process is performed to pattern the second insulating material layer and the first insulating material layer to obtain the patterned insulating layers 156b and 156c. Accordingly, the resultant electrode 156 (e.g. sandwich diaphragm) can be formed with the through-holes 158. The insulating layers 156b and 156c in the electrode 156 may be made of the same or different materials, such as silicon nitride, silicon oxynitride or amorphous silicon, which differs from that of the passivation layer 154. The conductive layer 156a may be made of metal, such as Aluminum, Copper, or Gold. In an embodiment, the conductive layer 156a can be Aluminum, Copper, or Gold, with a thickness of about 300 angstroms to 2000 angstroms, possibly about 1000 angstroms, while the insulating layers 156b and 156c can be silicon nitride with a thickness of about 3000 angstroms to 10000 angstroms, possibly about 7000 angstroms, respectively.

Figure 1D:
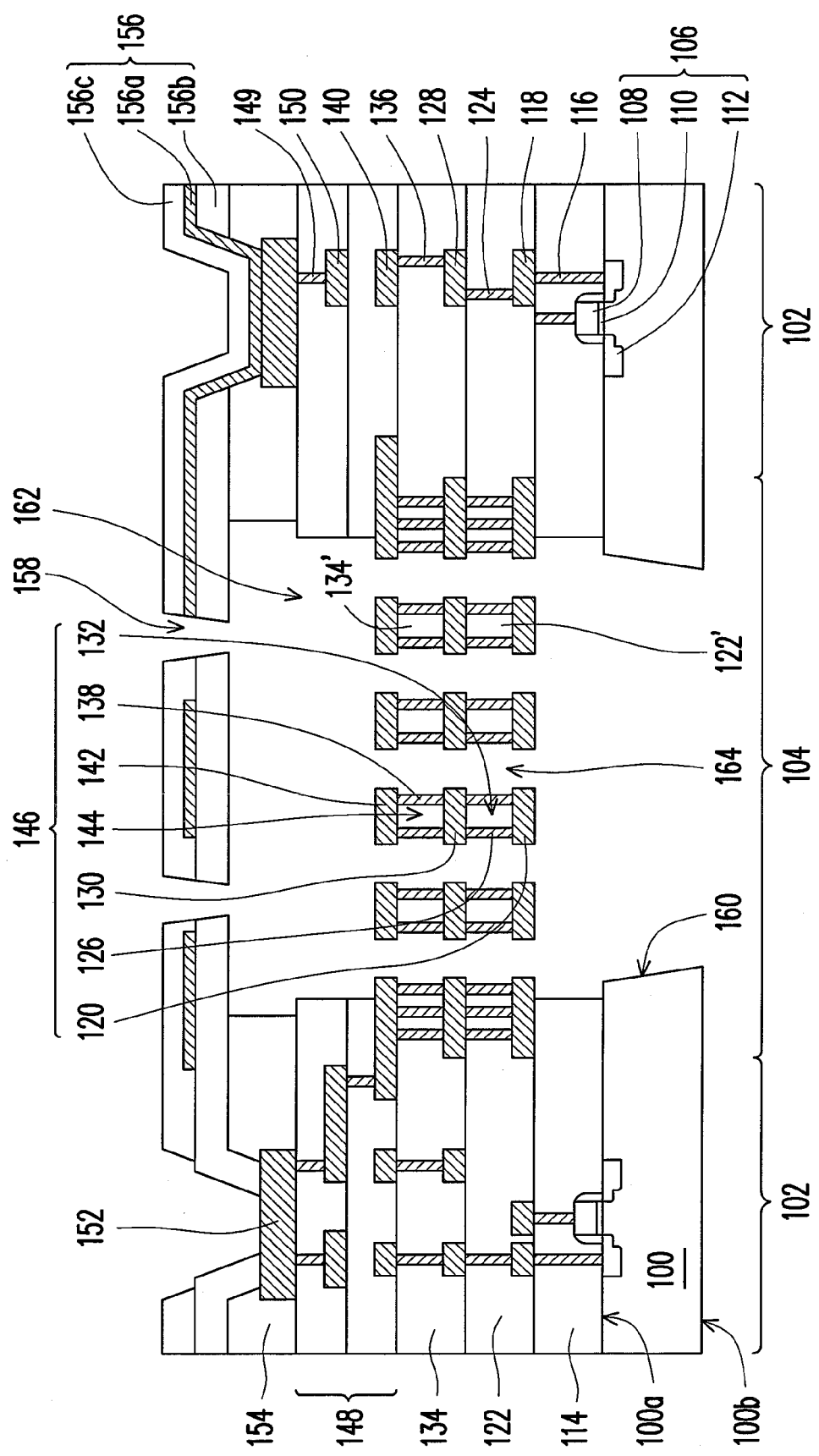

Referring to FIG. 1D, a portion of the substrate 100 is removed to form an opening 160, so as to expose the dielectric layer 114 within the MEMS region 104. The formation of the opening 160 can be carried out by performing a lithography process and a successive etching process to remove a portion of the substrate 100 from the back side 100b until the dielectric layer 114 is exposed. After the opening 160 is formed, the dielectric layers 114, 122, 134 and 148 and the passivation layer 154 located thereon are removed through the opening 160, so that a cavity 162 is formed between the electrodes 146 and 156. Hence, the fabrication of the MEMS device, e.g. MEMS microphone, according to the present invention is accomplished in the MEMS region 104. It is noted that only the exposed dielectric layers 114, 122, 134 and 148 and the passivation layer 154 within the MEMS region 104 are removed, instead of completely removing the dielectric layers 114, 122, 134 and 148 and the passivation layer 154 in the circuit region 102. Accordingly, the electrodes 146 and 156 can be suspended upon the front side 100a of the substrate 100 within the MEMS region 104. The dielectric layers 114, 122, 134 and 148 and the passivation layer 154 are removed by, for example, performing a wet etching process or a dry etching process with plasma.

Moreover, the metal layer 120 may have the meshed pattern, and the metal layers 130 and 142 stacked thereon can have a profile corresponding to the metal layer 120, that is, with meshed pattern. As shown in FIGS. 1D and 2, after the removal of the dielectric layers 114, 122, 134 and 148 and the passivation layer 154, a plurality of vent holes 164 are therefore formed in the electrode 146. The vent holes 164 are in communication with the cavity 162. It should be noticed that the annular vent holes 164 is illustrated only as an exemplary example, which is not to be construed as limiting the present invention. In other embodiments, people skilled in the art should be able to make modifications of the contours of the vent holes in accordance with requirements for the MEMS device.

Since the electrode 146 in the form of a stacked structure includes the protection rings 126 and 138 connecting the adjacent metal layers 120, 130 and 142, the dielectric material disposed in the enclosed spaces 132 and 144 can be well protected by the protection rings 126 and 138. That is to say, during the etching process of removing the partial dielectric materials, the dielectric layers 122' and 134' can be retained in the enclosed spaces 132 and 144, when the dielectric layers 114, 122, 134 and 148 outside the protection rings 126 and 138 are removed. As such, the electrode 146 having multiple metal layers 120, 130 and 142 can be provided with high stiffness and strength, and the dielectric layers 122' and 134' sandwiched in between two adjacent metal layers 120, 130 and 142 may compensate the residue stress of the metal layers 120, 130 and 142, so as to prevent the metal from bending. Further, the structure composed of the metal layers 120, 130 and 142 and the protection rings 126 and 138 is a conductor, i.e. metal, with a large area, so that induced capacitance between the electrodes 146 and 156 can thus be enhanced. Accordingly, sensitivity and performance of the resultant MEMS device can be improved effectively. In addition, the structure of the backplate, i.e. electrode 146, in the MEMS region 104 described above can be integrated with the interconnection process in the circuit region 102 simultaneously, such that the fabrication of the MEMS device can thus be carried out by the techniques applied to the interconnection process, thereby simplifying the process and increasing the throughput.

In an embodiment, an isolation structure (not shown) may be optionally formed between the circuit region 102 and the MEMS region 104 during the fabrication of the interconnection structure, such that the dielectric layers 114, 122, 134 and 148 and the passivation layer 154 disposed in the circuit region 102 can be further protected as performing the etching process to the dielectric material. The formation of the isolation structure is, for example, simultaneous with the formation of each corresponding layer in the interconnection structure.

Certainly, the construction of the MEMS device is not particularly limited in this invention. The amounts of the metal layers, the protection rings, the wires and the vias which constitute the MEMS device and the interconnection structures are not limited to those shown in FIG. 1D. In other embodiments, one of ordinary skill in the art can modify the layout as desired, and the amounts of the metal layers, the protection rings, the wires and the vias can be varied in accordance with individual requirements. Accordingly, the electrode 146 (i.e. backplate) can be formed by stacking only two metal layers and a protection ring therebetween to define an enclosed space or, in the alternative, by stacking more than two metal layers and a plurality of protection rings correspondingly disposed between the adjacent metal layers to define a plurality of enclosed spaces.

Figure 3:
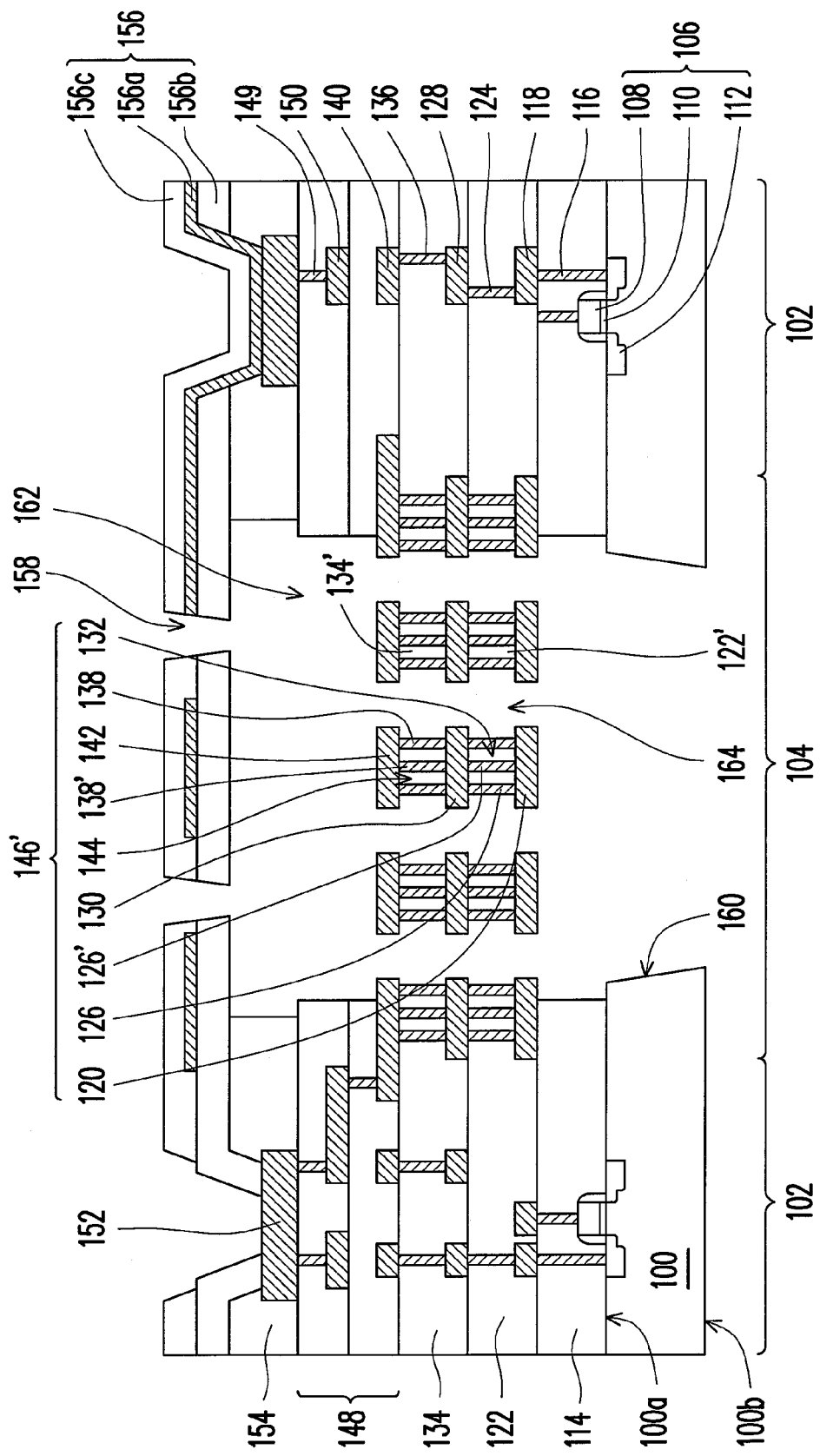
FIG. 3 depicts, in a cross-sectional view, a MEMS device according to another embodiment of the present invention.

In addition, FIG. 3 depicts, in a cross-sectional view, a MEMS device according to another embodiment of the present invention. In another embodiment, as shown in FIG. 3, protection rings 126' can be optionally formed in the enclosed spaces 132 and connecting the adjacent metal layers 120 and 130, and protection rings 138' can be optionally formed in the enclosed spaces 144 and connecting the adjacent metal layers 130 and 142. In other words, owing to the additional protection rings 126' and 138' in the enclosed spaces 132 and 144 respectively between the metal layers 120, 130 and 142, the electrode 146' can possess even higher stiffness and strength, and the dielectric layers 122' and 134' can also be ensured their containing in the enclosed spaces 132 and 144. The material of the protection rings 126' and 138' can be chosen as the same of the protection rings 126 and 138. The method for forming the said structures can be well appreciated by persons skilled in the art based on the above embodiment, and thus, the detailed descriptions thereof are not described herein.

A MEMS device according to an embodiment of the present invention is then illustrated with the structure shown within the MEMS region 104 of FIG. 1D. It should be noted that the details of the materials, effects and forming methods of each component in the MEMS device have been described explicitly in the foregoing embodiments, and will be omitted hereinafter.

Referring to FIG. 1D again, the MEMS device, which may be a microphone, includes the electrodes 146 and 156. In an embodiment, the electrode 146 may function as the backplate, while the electrode 156 may function as the diaphragm. The electrodes 146 and 156 are disposed on the substrate 100, for example, in a suspended manner.

In detail, the electrode 146 can include the vent holes 164, as illustrated in FIGS. 1D and 2. The electrode 146 includes the metal layers 120, 130 and 142, the protection rings 126 and 138 and the dielectric layers 122' and 134'. The metal layers 120, 130 and 142 may be formed on the substrate 100 in a stacked manner. The protection rings 126 and 138 respectively connect the adjacent metal layers 120, 130 and 142, so as to define the enclosed spaces 132 and 144 therebetween. In an embodiment, each of the protection rings 126 and 138 may substantially correspond to the profile of the metal layers 120, 130 and 142. The protection rings 126 and 138, for example, have annular shapes approximating to the profile of the vent holes 164, and may connect to the inside near to the edge of the metal layers 120, 130 and 142, respectively. The material of the protection rings 126 and 138 can be metal. The dielectric layers 122' and 134' are disposed in the enclosed spaces 132 and 144 respectively, so as to connect the adjacent metal layers 120, 130 and 142.

In another embodiment, as shown in FIG. 3, the electrode 146' may further includes the additional protection rings 126' and 138' disposed in the enclosed spaces 132 and 144 respectively and connecting the metal layers 120, 130 and 142. The material of the protection rings 126' and 138' is, for example, metal.

The electrode 156 is disposed on the electrode 146, wherein the cavity 162 is formed between the electrodes 146 and 156. The electrode 156 may include the insulating layers 156b and 156c, and the conductive layer 156a located therebetween, so as to form a sandwich structure.

Since two adjacent metal layers 120, 130 and 142 are connected by the protection rings 126 and 138 and the dielectric layers 122' and 134', the dielectric material can compensate the residue stress of the metal layers 120, 130 and 142 to prevent bending. Accordingly, the electrode 146 can be provided with high stiffness, and thereby the performance of the resultant MEMS device can be improved effectively.

In view of the above, the MEMS device and the fabricating method thereof in the present invention at least have the following advantages.

1. The MEMS device in the foregoing embodiments have high stiffness and strength, and can reduce the residue stress of the material, thereby improving the sensitivity and the performance of the device.

2. The method for fabricating the MEMS device in the foregoing embodiments can easily incorporated into the existing CMOS process, that is, the integrated circuit and the MEMS device can be fabricated at the same time. Thus, the effects of simplifying the fabrication and enhancement of throughput can be easily achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a microelectromechanical system (MEMS) device, comprising:
   providing a substrate, comprising a circuit region and a MEMS region separated from each other;
   forming an interconnection structure on the substrate in the circuit region, and simultaneously forming a plurality of dielectric layers and a first electrode on the substrate in the MEMS region, wherein the first electrode comprises:
      at least two metal layers, formed in the dielectric layers; and
      a first protection ring, formed in the dielectric layers and connecting two adjacent metal layers, so as to define an enclosed space between the two adjacent metal layers;
   forming a second electrode on the first electrode; and
   removing the dielectric layers outside the enclosed space in the MEMS region.

2. The method according to claim 1, wherein the first protection ring substantially corresponds to a profile of each of the at least two metal layers.

3. The method according to claim 1, wherein the first protection ring comprises metal.

4. The method according to claim 1, further comprising forming a second protection ring in the enclosed space and connecting the two adjacent metal layers.

5. The method according to claim 4, wherein the second protection ring comprises metal.

6. The method according to claim 1, wherein after removing the dielectric layers outside the enclosed space in the MEMS region, a plurality of vent holes are formed in the first electrode.

7. The method according to claim 1, wherein the step of forming the second electrode comprises:
   forming a first insulating layer and a second insulating layer on the dielectric layers, wherein the second insulating layer is formed above the first insulating layer; and
   forming a conductive layer between the first insulating layer and the second insulating layer.

8. The method according to claim 1, further comprising forming a passivation layer on the interconnection structure and the dielectric layers before forming the second electrode.

9. The method according to claim 8, further comprising removing the passivation layer in the MEMS region, so that a cavity is formed between the first electrode and the second electrode.

10. The method according to claim 1, further comprising forming a metal oxide semiconductor device in the circuit region before forming the first electrode, wherein the MOS device connects with the interconnection structure.

11. The method according to claim 1, wherein after removing the dielectric layers outside the enclosed space in the MEMS region, the dielectric layers remained in the enclosed space connect the two adjacent metal layers.

* * * * *